United States Patent [19]

Yang et al.

[11] Patent Number: 5,019,771
[45] Date of Patent: May 28, 1991

[54] CONTACT SENSING FOR INTEGRATED CIRCUIT TESTING

[75] Inventors: Tsen-Shau Yang, Cupertino; Ger-Chih Chou, San Jose; Fu-Chieh Hsu, Saratoga, all of Calif.

[73] Assignee: Knights Technology, Inc., Santa Clara, Calif.

[21] Appl. No.: 527,661

[22] Filed: May 21, 1990

Related U.S. Application Data

[63] Continuation of Ser. No. 349,203, May 9, 1990, abandoned, which is a continuation-in-part of Ser. No. 334,256, Apr. 5, 1988, abandoned.

[51] Int. Cl.[5] .................... G01R 27/04; G01R 31/28
[52] U.S. Cl. .................... 324/158 P; 324/158 F; 324/158 R; 324/73.1; 364/555.01
[58] Field of Search .................. 324/72.5, 73.1, 158 F, 324/158 P; 364/551.01; 371/15, 16

[56] References Cited

U.S. PATENT DOCUMENTS

| | | | |
|---|---|---|---|
| 3,979,670 | 9/1976 | Vahaviolos | 324/103 P |
| 3,996,517 | 12/1976 | Fergason et al. | 324/158 F |
| 4,175,253 | 11/1979 | Pitegoff | 324/158 P |
| 4,342,957 | 8/1982 | Russell | 324/158 P |
| 4,342,958 | 8/1982 | Russell | 324/158 P |
| 4,651,088 | 3/1987 | Sawada | 324/158 R |
| 4,714,875 | 12/1987 | Bailey et al. | 324/73 R |
| 4,780,836 | 10/1988 | Miyazaki et al. | 324/158 P |

OTHER PUBLICATIONS

"Micromanipulator Vision for Wafer Probing"; *IEEE Transactions on Semiconductor Manufacturing;* Vol. 2, No. 3 (August 1989)

*Primary Examiner*—Kenneth Wieder
*Assistant Examiner*—Vinh P. Nguyen
*Attorney, Agent, or Firm*—Townsend and Townsend

[57] ABSTRACT

A technique for detecting whether electrical contact between a probe tip and a device under test ("DUT") has been established. A contact sensing circuit has a ground that is isolated from the ground of the DUT (and remaining portions of the test equipment) during contact sensing. The contact sensing circuit has elements that operate to apply a characteristic signal to one of the DUT terminals, such as its ground terminal. This causes virtually all the DUT circuit traces to track the applied signal (relative to the contact sensing ground). The contact sensing circuit further includes elements, coupled to the probe, that operate to detect the presence of the characteristic signal (relative to the contact sensing ground) on the probe. Once electrical contact has been established, the characteristic signal output is disconnected from the DUT, the test equipment ground is connected to the contact sensing circuit ground, and the probe output is coupled to the relevant portions of the test equipment circuitry.

12 Claims, 4 Drawing Sheets

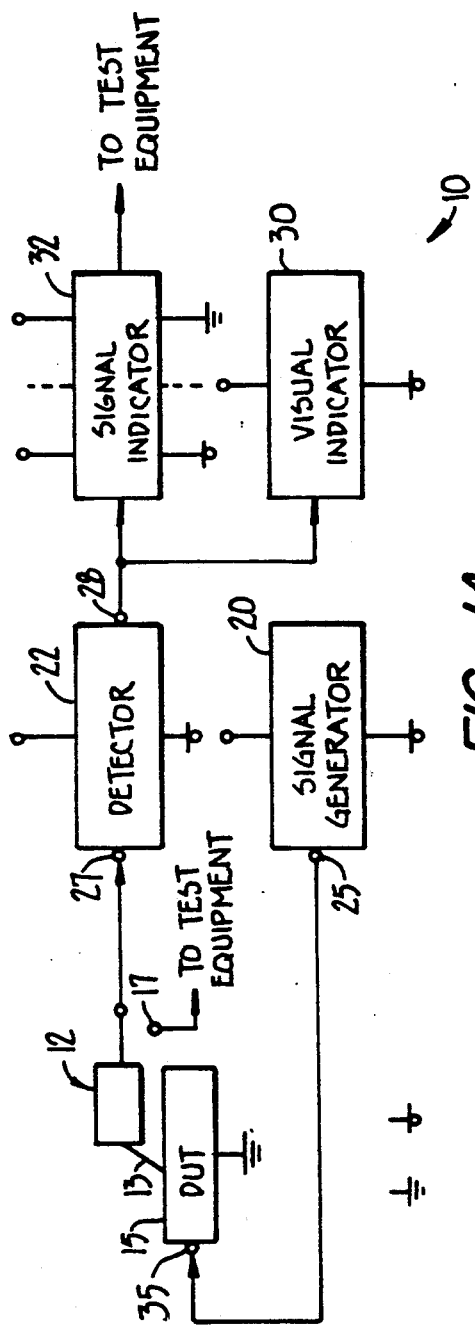
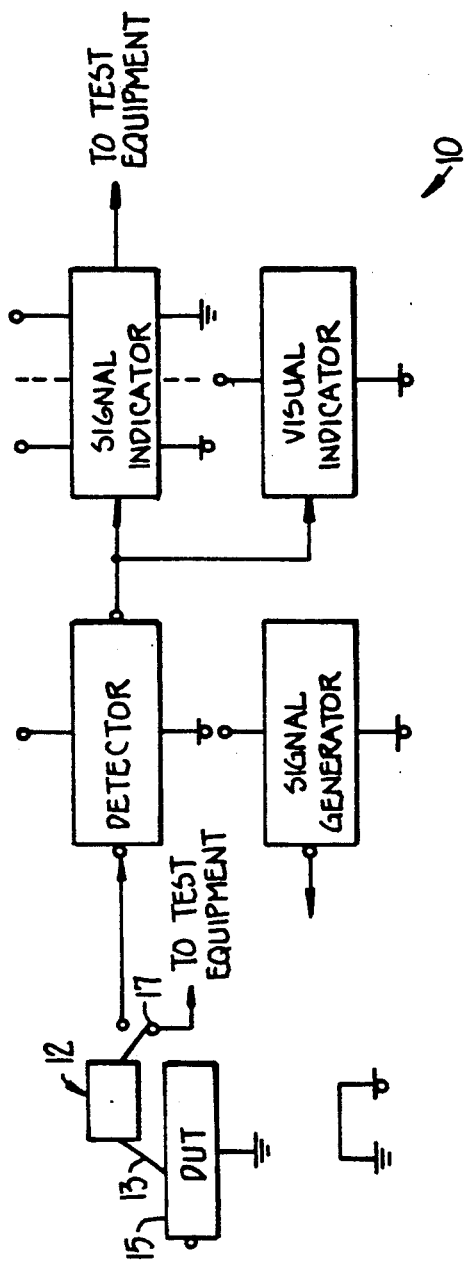

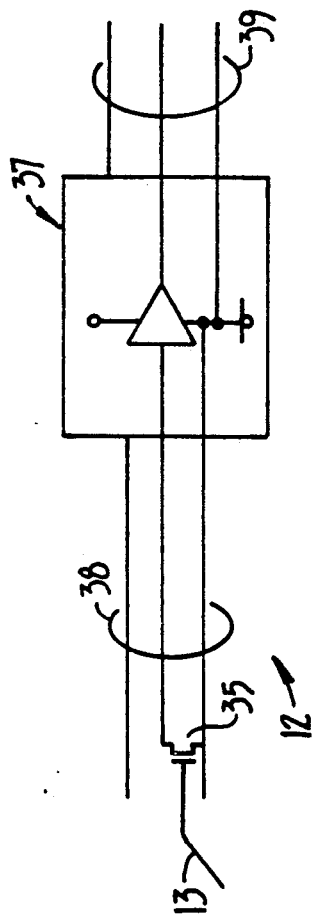
FIG._2.
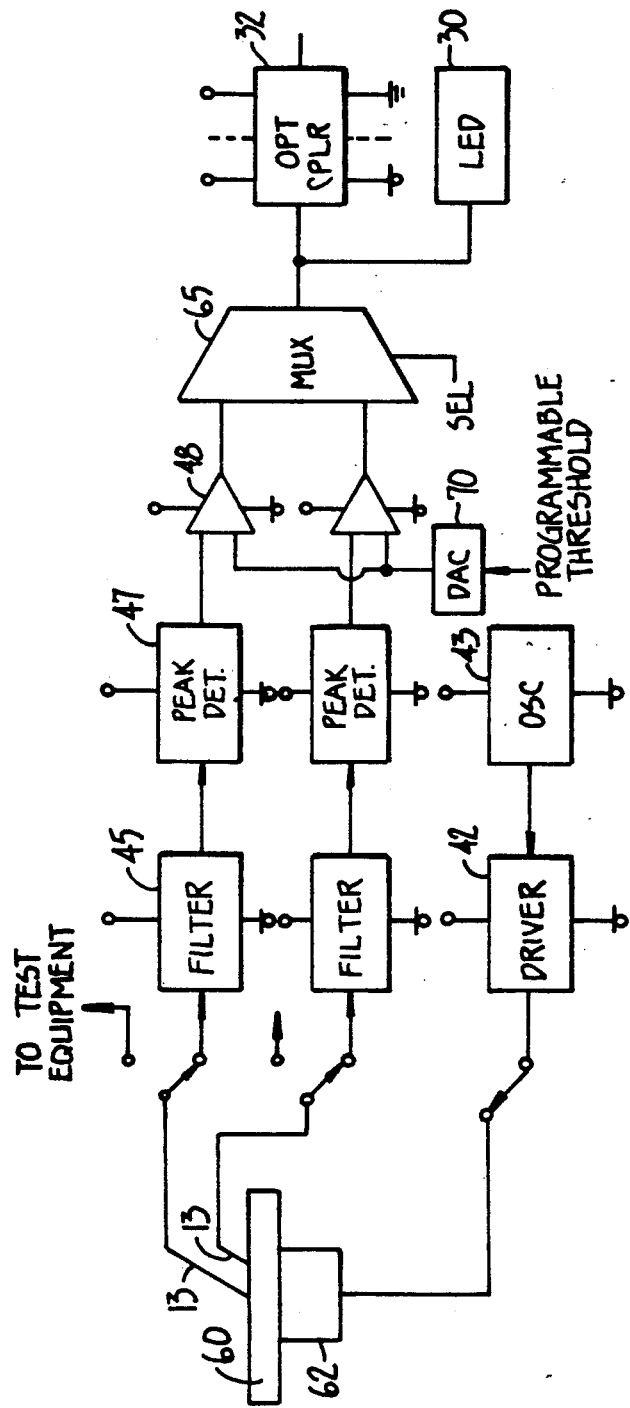
FIG._4.

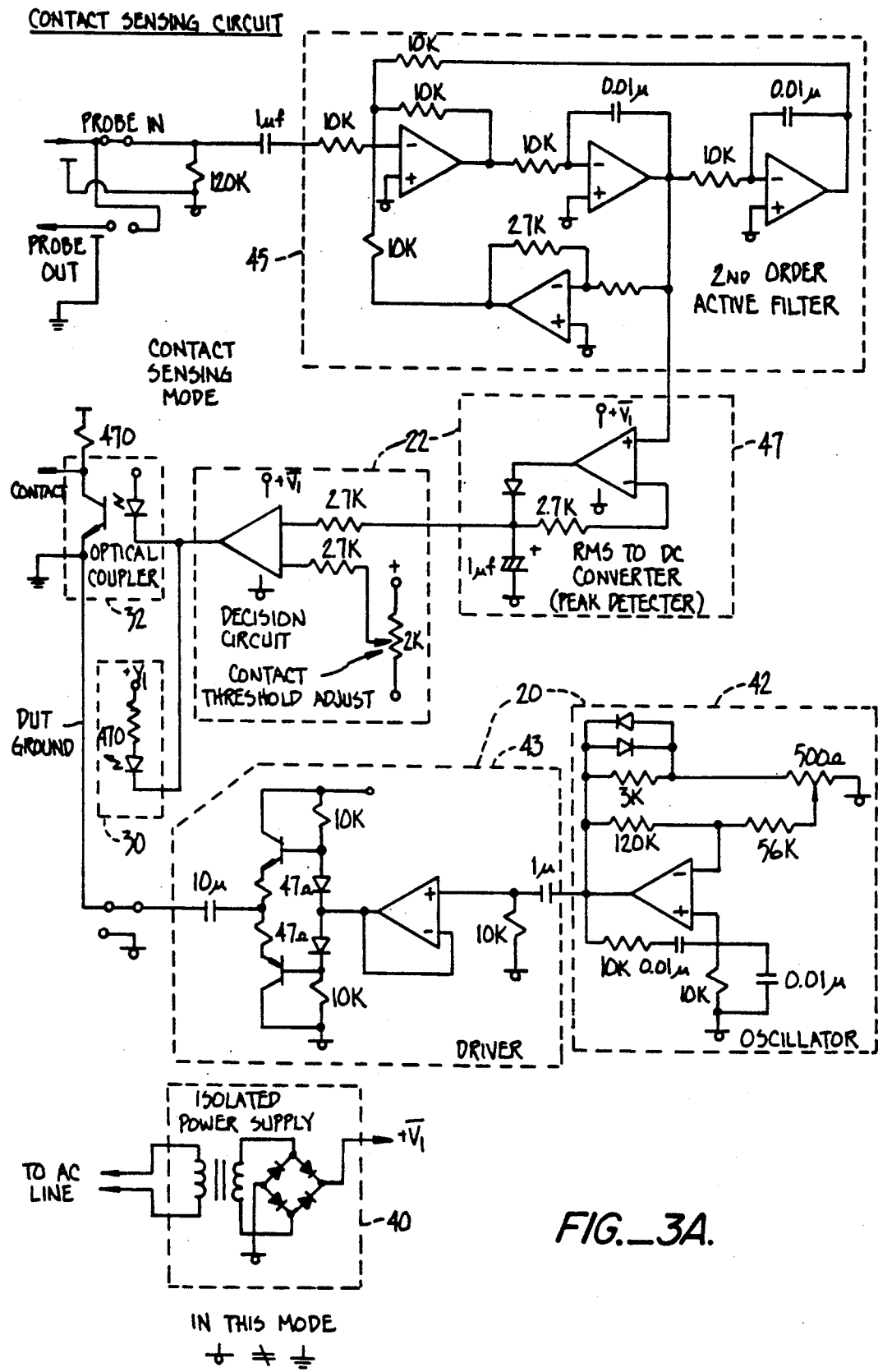
FIG._3A.

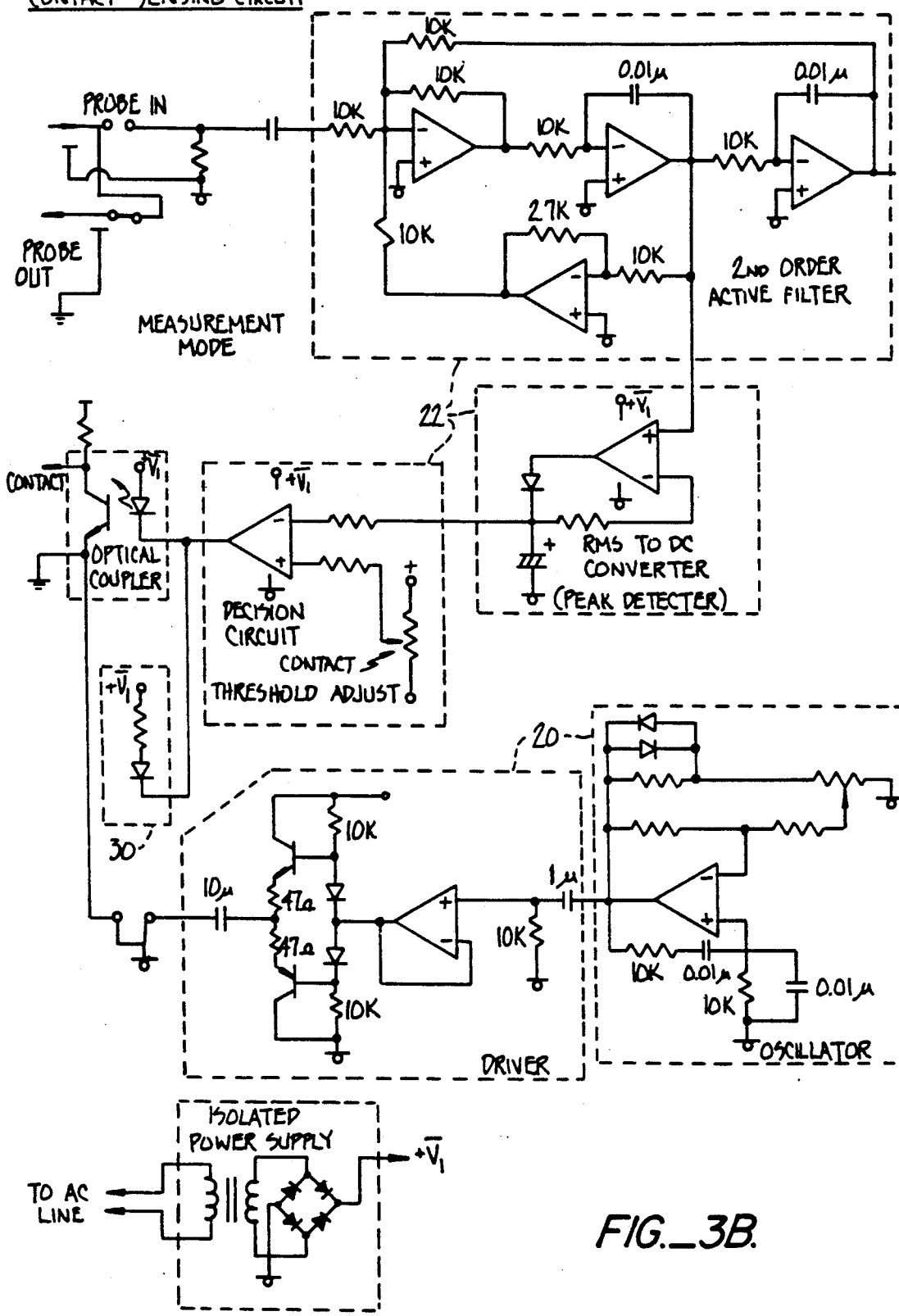
FIG._3B.

CONTACT SENSING FOR INTEGRATED CIRCUIT TESTING

This is a continuation of application Ser. No. 349,203, filed May 9, 1990, now abandoned, which is a continuation-in-part of U.S. Ser. No. 334,256, filed Apr. 5, 1988, now abandoned.

BACKGROUND OF THE INVENTION

The present invention relates generally to testing of integrated circuits, and more specifically to a technique for determining whether a probe has made electrical contact to a node in a device under test.

It is well known practice to test integrated circuit devices prior to dicing the wafer and packaging the chips. In a typical test environment, integrated circuit testing typically involves a wafer sort, carried out before dicing, wherein the wafer is placed on a vacuum chuck and each die is tested. Testing a given die entails bringing a probe card with a number of probe tips into registration with the die so that each bond bad is contacted by a corresponding probe tip. Thereafter, various voltage levels, signals, and combinations of signals are applied to the inputs of an integrated circuit device under test ("DUT") and the DUT's response at its outputs is analyzed. Testing at this level only requires access to the DUT's bond pads, which are large. However, due to the large number of probes (say 100), establishing simultaneous contact is a vexing problem.

Moreover, such testing does not always provide the complete picture. It may often become necessary to determine the signal response at one or more internal circuit nodes. Access to internal nodes is sometimes provided by test pads, which are typically much smaller than the bond pads. Under some circumstances, it may even be necessary to probe the conductive paths on the active area of the chip.

A typical approach uses a probe having a fine wire tip. In present circuit technologies, the conductive paths are very narrow, and direct probing requires steps to avoid damage to the chip. More particularly, it is important to avoid excessive mechanical force, while still providing a method of accurately determining when suitable electrical contact has been made.

In one approach, contact may be ascertained by visual inspection. When the probe makes contact, further downward pressure causes it to slide along the surface of the chip, which can be detected visually. This method is not practical in an automated test environment.

One possible approach for automatic contact sensing uses a probe having two closely spaced tips, with a voltage generating and current detecting circuit connected in series between the probes. When both probe tips make contact with the device, the loop is closed, and current is detected.

This approach is presumably viable for some applications, but has a number of limitations. For example, unless the two tips make contact at the same time, the first tip to contact may exert excessive force before the second tip contacts. Further, the contact area is greater (which may be acceptable for probing bond pads). Furthermore, the dual-tipped probe introduces extra capacitive loading, even if the contact sensing circuitry is disconnected by relays when the probe is used in the measurement mode. Moreover, the dual-tipped probe is not suitable for use as an active probe (having a transistor amplifier located close to the actual probe tip), since it is impossible to make contact to the probe on the DUT side of the transistor.

Thus, it can be seen that despite the sophistication of the actual test equipment, the techniques for determining when the probe has actually made contact with the DUT are relatively crude. An Achilles' heel of sorts.

SUMMARY OF THE INVENTION

The present invention provides a simple effective technique for detecting whether a desired degree of electrical contact between a probe tip and a device under test ("DUT") has been established. The technique allows the contact status to be determined for both power on and power off conditions of the DUT, does not interfere with the DUT operation in power on condition, and is applicable to passive and active probes.

In broad terms, the invention contemplates a contact sensing circuit having a voltage reference (typically ground) that is suitably isolated from the ground of the DUT (and remaining portions of the test equipment) during contact sensing. The contact sensing circuit has elements that operate to apply a characteristic signal to one of the DUT terminals, such as its ground terminal. This causes virtually all the DUT circuit traces to track the applied signal (relative to the contact sensing reference). The contact sensing circuit further includes elements, coupled to the probe, that operate to detect the presence of the characteristic signal on the probe. For example, where the characteristic signal is a sine wave at a particular frequency, such detecting elements can include a band pass filter centered near that frequency and a decision circuit that provides a signal indicating whether the filter circuit has passed a predetermined component at that frequency.

The output from the detecting elements of the circuit may be transmitted to an LED indicator to provide a visual indication that the probe is in contact with the DUT and to a driver for an optical coupler to communicate the contact status to the remaining portions of the test equipment. Once electrical contact has been established, the characteristic signal output is disconnected from the DUT, the test equipment ground is connected to the contact sensing circuit ground, and the probe output is coupled to the relevant portions of the test equipment circuitry.

The invention is applicable to single- and multi-probe setups. In the case of multiple probes, each probe has its own detecting circuitry, and the characteristic signal may be applied to the wafer chuck if such is in use. The detector outputs are multiplexed to the optical coupler.

A further understanding of the nature and advantages of the present invention may be realized by reference to the remaining portions of the specification and the attached drawings.

BRIEF DESCRIPTION OF THE DRAWINGS

FIGS. 1A-B are block diagrams illustrating the contact sensing circuitry of the invention in the contact sensing and measurement modes;

FIG. 2 is a simplified schematic of a typical active probe;

FIGS. 3A-B are circuit schematics corresponding to FIGS. 1A-B; and

FIG. 4 is a block diagram illustrating a multi-probe embodiment.

DESCRIPTION OF THE PREFERRED EMBODIMENT

FIGS. 1A-B are block diagrams showing contact sensing circuitry 10 according to the present invention. Contact sensing circuitry 10 operates in conjunction with a probe 12 having a tip 13 to determine when tip 13 has made sufficient electrical contact with a device under test ("DUT") 15. In the preferred embodiment the DUT is an integrated circuit device (wafer or chip). Once contact is established, signals on probe 12 are made available to an appropriate input terminal 17 test equipment (not otherwise shown).

FIG. 1A shows the circuit configuration in the contact sensing mode. DUT 12 and the test equipment are powered by supplies having a common ground, referred to as DUT ground, which is denoted in the figures by a conventional 3-line symbol for ground. The elements of contact sensing circuitry 10 are powered by an isolated power supply whose ground, referred to as contact sensing ground, is denoted by a non-conventional symbol of a single horizontal line and small open circle. As will be described more fully below, the required degree of isolation depends on various characteristics of the circuit elements.

The basic elements of the contact sensing circuit include a signal generator 20 and a detector circuit 22. Signal generator 20 has an output terminal 25 at which it supplies a signal having a predetermined characteristic. In the preferred embodiment, the signal is a sine wave at a predetermined frequency. Detector 22 has an input terminal 27, and an output terminal 28 at which it provides a signal that is asserted if it detects an input signal at input terminal 27 exhibiting a sufficient degree of the defined characteristic.

The signal at detector output terminal 28 is optionally communicated to a visual indicator 30 and a signal indicator 32. Visual indicator 30 is preferably an LED that provides a visible indication that the signal at output terminal 28 is asserted. Signal indicator 32 provides a signal to the test equipment while maintaining isolation between the DUT ground and the contact sensing circuitry ground.

During contact sensing, the output signal from signal generator 20 is communicated to a node 35 on DUT 15. Node 35 may be the DUT ground, but can typically be any pin on the DUT. The signal appearing on probe 12 is disconnected from test equipment input terminal 17, and is communicated to detector input terminal 27. Since the contact sensing ground and the DUT ground are at least partially isolated from each other, the signal applied to node 35 is superimposed on the levels on virtually all nodes in DUT 15 (relative to contact sensing ground). Thus, when a sufficient degree of electrical contact between probe 12 and DUT 15 is established, the characteristic signal appears at detector input terminal 27, and the signal at detector output terminal 28 is asserted.

FIG. 1B shows the circuitry in the measurement mode, which is used once contact has been established. Appropriate relays effect three changes in the connections. First, the probe is no longer connected to detector input terminal 27, but rather is connected to test equipment input terminal 17. Second, the DUT ground and the contact sensing ground are coupled together. Third, the signal generator output signal is disconnected from the DUT and is not communicated to anything.

FIG. 2 is a simplified schematic of probe 12. A suitable active probe is marketed under the registered trademark PICOPROBE, and is available from GGB Industries, Inc., Naples, Fla. Although the probe is not part of the invention, a typical active probe will be described briefly. Probe tip 13 is a tungsten wire (10–50 micron diameter with a 0.5–3.0 micron point radius), which is connected to the input (gate) of a MOS device 35. The MOS device is coupled to an amplifier 37 by a rigid coaxial feed 38. The amplifier output is communicated to the test equipment and contact sensing circuitry via a coaxial cable 39.

FIG. 3A is a circuit schematic of the contact sensing circuit 10, showing the connections for the contact sensing mode. The circuitry includes an isolated power supply 40 that provides a DC voltage with respect to an isolated ground. Signal generator 20 comprises an oscillator 42 and an output driver 43. The oscillator output signal is communicated to the output driver and thence to a node on the DUT, preferably DUT ground. A typical operating frequency is on the order of 10 KHz, but this is not critical. Detector circuit 22 includes a second-order active filter 45, a peak detector 47, and a decision circuit 48. Filter 45 is tuned to pass signals at the oscillator frequency, and communicates its output to peak detector 47, which utilizes an RMS-to-DC converter. The output from peak detector 47 is communicated to decision circuit 48, which actuates optical coupler 32 in the event that the input signal is above a certain threshold. Optical coupler 32 provides a signal, referred to DUT ground, that signifies to the test equipment that contact has been made.

While various signal levels and thresholds are acceptable, in the preferred embodiment, the oscillator/driver applies a signal of about 10 volts (peak-to-peak) to the DUT, and the decision circuit threshold is set to provide a positive contact indication when about 100 mv of characteristic signal appears on the probe.

FIG. 3B is a circuit schematic showing the connections that are effected once electrical contact has been made. In the measurement mode, DUT ground and contact sensing ground are shorted together, the signal from signal generator 20 is disconnected from DUT ground (or the DUT node it was connected to, and the signal from the probe is communicated to the test equipment rather than to the contact sensing circuit.

FIG. 4 is a block diagram illustrating a multiple probe embodiment of the present invention. Reference numerals corresponding to those in FIGS. 1A-B and 3A-B are used where appropriate. A wafer 60, which is held on a vacuum chuck 62, is shown with two probe tips 13 in contact with the wafer surface. Each probe has an associated detector comprising a filter 45, a peak detector 47, and a decision circuit 48, typically as described above. The decision circuit outputs are communicated to a multiplexer 65, the output of which communicates to a signal indicator (optical coupler) 32 and a visual indicator (LED) 30.

As described above in connection with FIG. 3A, the decision circuit threshold is adjustable. The threshold inputs are connected to the output of a digital-to-analog converter ("DAC") 70, the input of which is programmable. Depending on the application, the threshold value could remain constant (once determined), or could be varied depending on the probe selected.

It is in theory possible to multiplex the probes and then use a single detection circuit. However, the detection circuits are characterized by delays due to their RC time constants. Thus, the time it takes for the circuit to settle would be incurred as each probe is sampled. While this might be acceptable for a few probes, the delay for a system with many probes could be prohibitive.

As described above, during contact sensing, the characteristic signal is applied to the DUT while the contact sensing ground is isolated from the DUT ground. For the wafer test, the signal can conveniently be applied to the vacuum chuck.

The above description was generally phrased in terms of contact between the probe and the DUT and isolation between the power supply grounds. However, it was also suggested that "contact" and "isolation" should be considered as relative terms rather than absolute terms.

Consider first the required degree of isolation between the two ground terminals when the circuit is in the contact sensing mode. A degree of isolation is needed so that the signal from signal generator 20 (which drives DUT ground) is not shorted out to contact sensing ground. In the preferred embodiment, the two grounds are actually connected by a resistor (about 10 K) and a capacitor (about 1–10 μf) in parallel so as to reduce noise. However, this represents a sufficiently high impedance for the characteristic signal from the signal generator. Thus, the degree of isolation need only be great enough that some reasonable level of the characteristic signal appear on the DUT.

Consider next the degree of probe-DUT contact that will give a positive indication from the detector circuit. Since contact is sensed by detecting a certain level of the characteristic signal from the probe, the degree of contact required for a positive indication can be controlled by adjusting the threshold in the detector circuit.

In conclusion, it can be seen that the present invention provides a simple and effective way to determine when a probe has made contact with a desired part of a DUT. This is accomplished automatically without affecting the subsequent test steps.

While the above is a complete description of the preferred embodiment of the present invention, various modifications, alternative constructions, and equivalents may be used.

For example, the characteristic signal need not be a sine wave. A square wave or other periodic signal generator could be used (the same type of filter would most likely still be appropriate). The characteristic doesn't even have to be frequency. Frequency shift keying techniques could be used and the characteristic shifts detected.

Moreover, while decision circuit 48 in the preferred embodiment provides a binary output, indicative of whether or not a desired degree of contact has been achieved, the signal from peak detector 47 allows a more refined determination (degree of contact) if such is desired. This could allow a determination of contact impedance, which would correlate with contact pressure.

Therefore, the above description and illustrations should not be taken as limiting the scope of the present invention which is defined by the appended claims.

We claim:

1. Circuitry for use with test apparatus having a test apparatus input terminal and an associated probe having a probe tip and a probe output, for sensing the status of electrical contact between the probe tip and a device under test ("DUT") in the test apparatus, comprising:

generator means, having a generator reference terminal and a generator output terminal, for providing a first signal on said generator output terminal relative to said generator reference terminal, said first signal having a defined characteristics; and detector means, having a detector input terminal, a detector output terminal, and a detector reference terminal, for providing a second signal on said detector output terminal relative to said detector reference terminal, said second signal representing the amount of signal having the defined characteristic relative to said detector reference terminal appearing at said detector input terminal;

said generator and detector reference terminals being electrically connected to each other; and means for selectively establishing a contact sensing mode and a measurement mode, said contact sensing mode being characterized in that said generator and detector reference terminals are at least partially isolated from the DUT, said generator output terminal is coupled to the DUT, and the probe output is disconnected from the test apparatus input terminal and coupled to said detector input terminal, whereupon said second signal provides an indication of the degree of electrical contact between the probe tip and the DUT, said measurement mode being characterized in that said generator output terminal is disconnected from the DUT and the probe output is disconnected from the detector input terminal and coupled to the test apparatus input terminal.

2. The circuit of claim 1 wherein said generator means is a sine wave oscillator having a characteristic frequency.

3. The circuit of claim 2 wherein said detector means comprises a band pass filter operable to pass signals at said characteristic frequency.

4. The circuit of claim 3 wherein said detector means further comprises a peak detector coupled to said band pass filter.

5. The circuit of claim 1, and further comprising visual indicator means, responsive to said second signal, for providing a visual indication of a desired degree of contact.

6. The circuit of claim 5 wherein said visual indicator means comprises an LED.

7. The circuit of claim 1, and further comprising optical coupling means, responsive to said second signal, for generating a signal representative of said second signal relative to a reference that is not isolated from the DUT.

8. Circuitry for sensing the status of electrical contact between a plurality of probes and a device under test ("DUT"), comprising:

generator means, having a generator reference terminal and a generator output terminal, for providing a first signal on said generator output terminal relative to said generator reference terminal, said first signal having a defined characteristic; and a corresponding plurality of detector means, each associated with a respective one of the probes, each having a detector input terminal, a detector output terminal, and a detector reference terminal, for providing a second signal on said detector output terminal relative to said detector reference terminal, said second signal representing the amount of signal having the defined characteristic relative to said detector reference terminal appearing at said detector input terminal;

said generator and detector reference terminals being electrically connected to each other; and means for selectively establishing a contact sensing mode and a measurement mode, said contact sensing mode being characterized in that said generator and detector reference terminals are at least partially isolated from the DUT, said generator output terminal is coupled to the DUT, and the probes are coupled to said detector input terminals, whereupon said second signals provide indications of the degree of electrical contact between the probe tips and the DUT, said measurement mode being characterized in that said generator output terminal is disconnected from the DUT and said probe is connected to the test apparatus.

9. The circuitry of claim 8, and further comprising:
a multiplexer having multiplexer inputs coupled to said detector output terminals and a multiplexer output that provides a selected one of said second signals.

10. A method of sensing the status of electrical contact between a probe and a device under test ("DUT"), comprising the steps of:
applying a signal having a defined characteristic to a node on the DUT, the signal being referenced to a level at least partially isolated from the DUT;
sensing signals on the probe relative to the level at least partially isolated from the DUT; and
determining the degree to which the signals on the probe having the defined characteristic.

11. The method of claim 10 wherein the DUT is a die on a wafer which is held to a chuck, and wherein said applying step comprises applying the signal to the chuck.

12. The method of claim 10 wherein said applying step comprises applying the signal to DUT ground.

* * * * *